United States Patent [19]

Uomi et al.

[11] Patent Number: 4,752,933
[45] Date of Patent: Jun. 21, 1988

[54] SEMICONDUCTOR LASER

[75] Inventors: Kazuhisa Uomi; Shinichi Nakatsuka, both of Kokubunji; Takashi Kajimura; Yuichi Ono, both of Tokyo; Naoki Chinone, Hachioji, all of Japan

[73] Assignee: Hitachi, Ltd., Tokyo, Japan

[21] Appl. No.: 817,038

[22] Filed: Jan. 8, 1986

[30] Foreign Application Priority Data

Jan. 23, 1985 [JP] Japan .................................. 60-8978

[51] Int. Cl.$^4$ .......................... H01S 3/19; H01S 3/08; H01L 27/12; H01L 45/00
[52] U.S. Cl. ........................................ 372/46; 372/44; 372/45; 372/96; 357/4; 357/16
[58] Field of Search ....................... 372/44, 45, 46, 96; 357/4, 16

[56] References Cited

U.S. PATENT DOCUMENTS 4,378,255  3/1983  Holonyak, Jr. et al. .............. 372/45
4,594,603  6/1986  Holonyak, Jr. ........................ 372/46

OTHER PUBLICATIONS

Semura et al. "AlGaAs/GaAs Multiquantum Well Lasers with Buried Multiquantum Well Optical Guide" Japanese Journal of Applied Physics, vol. 24, No. 7, Jul., 1985, pp. L548–L550.

Primary Examiner—Gene Wan
Assistant Examiner—Michael Shingleton
Attorney, Agent, or Firm—Antonelli, Terry & Wands

[57] ABSTRACT

A semiconductor laser which has a super lattice layer between a substrate and a light confinement layer, and in which a portion of the super lattice layer other than a portion corresponding to the radiation region of an active layer is disordered to block the electric current. The disordering is effected in a self-aligned manner to simplify the manufacturing process. Therefore, and element which oscillates and maintains a fundamental transverse mode is obtained with a good yield.

16 Claims, 3 Drawing Sheets

SEMICONDUCTOR LASER

BACKGROUND OF THE INVENTION

The present invention relates to a semiconductor laser, and particularly to a semiconductor laser which is fabricated by an epitaxial growth method which is based upon a nonequilibrium growth mechanism such as metal-organic chemical vapor deposition (hereinafter referred to as MOCVD method), molecular beam epitaxy (hereinafter referred to as MBE method) or the like.

It is essential for a semiconductor laser to be provided with structure to stabilize a transverse mode. Prior art semiconductor lasers prepared by liquid phase epitaxy, such as a CSP (channeled substrate planar) laser are known, in which a substrate is provided with a groove stripe and a planar active layer is fabricated by utilizing a growth mechanism which is specific to the liquid epitaxy. However, if crystals are grown on the substrate provided with the groove stripe by an epitaxial growth method which is based upon a nonequilibrium growth mechanism such as a MOCVD method or a MBE method, the active layer is bent by the specific growth mechanism which maintains the shape of the substrate. Therefore, the light guiding effect achieved by the CSP laser is not expected. Further, lattice defects are formed in the active layer which results in deterioration of reliability. Therefore, it is known to grow the crystal such that a planar active layer is fabricated, and then to provide another layer on the active layer to stabilize the transverse mode. An example thereof is shown in FIG. 1. This laser structure has been disclosed by J. J. Coleman et al., Applied Physics Letters, 1980, Vol. 37, p. 262.

According to this method of fabricating the laser, there are successively formed an n-GaAs buffer layer 2, an n-GaAlAs cladding layer 3, an active layer 4, a p-GaAlAs cladding layer 5, and an n-GaAs current blocking layer 6 on an n-GaAs substrate 1 by MOCVD method. Then, the upper current blocking layer 6 in which the laser oscillation takes place, is removed by photolithography and chemical etching. Thereafter, a p-GaAlAs cladding layer 7 and a p-GaAs cap layer 8 are grown by MOCVD method.

Next, an n electrode 9 and a p electrode 10 are formed. According to this structure, the current injection is restricted within the radiation region by the current blocking layer 6, and the fundamental transverse mode is realized due to light absorption of the current blocking layer 6 outside the stripe region. However, since the surface of the p-GaAlAs cladding layer 5 has been oxidized, the growth of the further layers will result in abnormal layer formation at the interface and dislocation lines 11 are formed due to dependence on the orientation facet of the crystal that is grown. Therefore, the laser characteristics are deteriorated and the reliability is lowered.

Further, according to Kuroda et al., preparatory documents for the National Convention of the Association of Electronic Communications, Department of Optical-Electromagnetic Waves, 1984, Vol. 2, p. 23, there is disclosed a method of stabilizing the transverse mode by providing a multi-quantum well (MQW) layer as an optical guide layer on the active layer, and by restricting the radiation region by disordering both sides of the MQW layer by the diffusion of impurities. However, this method involves technical difficulty with respect to limiting the depth of diffusion within a range of the thickness of the cladding layer that is in contact with the active layer.

SUMMARY OF THE INVENTION

The present invention is concerned with the structure for stabilizing the transverse mode in a semiconductor laser device which is fabricated by an epitaxial growth method having a nonequilibrium growth mechanism such as a MOCVD method or a MBE method.

In the conventional lasers fabricated by a MOCVD method or a MBE method as described above, there existed problems in that the active layer was bent and lattice defects developed during the growth of the further layers.

The inventors have therefore fabricated flatly grown layers for a semiconductor laser, and have formed a device structure provided with a stabilized transverse mode and without the disadvantages of the prior art.

The present invention relates to a laser structure as described above avoiding the disadvantages of the prior art. The present invention will be described in conjunction with FIG. 2 which illustrates, in cross section, the structure of a GaAs-GaAlAs type semiconductor laser according to one embodiment of the present invention. In this structure, a p-GaAlAs cladding layer 5 and an n-GaAlAs cladding layer 3 are formed with an active layer 4 interposed therebetween, and a supper lattice layer 12 is formed between the n-GaAlAs cladding layer 3 and a substrate 1.

The super lattice layer 12 is made up of a periodic structure of a $Ga_{1-x}Al_xAs$ ($0 < x < 0.3$) well layer having a thickness of 1 to 20 nm and a $Ga_{1-y}Al_yAs$ ($y > x$, $0.1 < y > 1$) barrier layer having a thickness of 1 to 20 nm, the number of periods being 1 to 150.

The super lattice layer 12 outside the lasing region includes a disordered region 13 which is formed by forming the super lattice layer on the whole surface of the substrate, and diffusing p-type impurities or implanting ions into the super lattice layer except the region that corresponds to the radiation region. In order to disorder the super lattice layer, zinc is often used since it diffuses well at a temperature of 500° to 800° C. When ions are to be implanted, $Be^+$ ions or Si ions are implanted with the energy of about 200 KeV. When the super lattice is disordered and changed in solid solution the refractive index decreases as has been reported by Suzuki et al. in J. Electron Materials 12, 1983, p. 397. Therefore, the refractive index of the super lattice layer 12 becomes greater than the refractive index of the region 13, and the light emitted from the active layer 4 is guided within a stripe region and is stabilized to a fundamental transverse mode due to the difference in the refractive index. The n-GaAlAs cladding layer 3 should have a thickness that permits the light to penetrate into the region 13. The effective forbidden band gap energy of the super lattice region is usually greater than that of the active layer. Moreover, a current blocking layer is formed by a p-n inverse junction between the n-GaAlAs cladding region 3 and the layer 13. Therefore, the electric current is confined in the area corresponding to the radiation region. In FIG. 2, the super lattice layer is disordered except the area corresponding to the radiation region, and a p-inverted GaAs layer 14 is formed. However, nearly the same effects can be obtained even when the super lattice layer is left in some regions in addition to the area corresponding to the radiation region as shown in FIG. 3.

According to the present invention as described, a semiconductor laser is produced which maintains a stabler fundamental transverse mode and which has a current blocking structure that is formed in a self-aligned method by a simple process of diffusing impurities or implanting ions in growing crystals by a MOCVD method or a MBE method. An equation for calculating the effective forbidden band gap energy of the super lattice structure has been explained in a textbook of quantum mechanics, e.g., "Quantum Mechanics", written by Shiff (phonetic), p. 43, published by Yoshioka Shoten.

In producing an semiconductor laser by the epitaxial growth method having a nonequilibrium mechanism such as a MOCVD method or a MBE method according to the present invention, the structure for stabilizing the transverse mode and for blocking the current can be formed in a self-aligned method by simply disordering the super lattice by diffusing impurities or by implanting ions.

The super lattice layer can be easily disordered maintaining an ample allowance and permitting little variance in characteristics. Therefore, the active layer is not bent and lattice defects are eliminated unlike conventional structures for stabilizing transverse mode, and the process can be simplified. Accordingly, a laser chip having a fundamental transverse mode of a wavelength of 780 nm with an optical output of up to 50 mWCW can be obtained while maintaining a good yield. If the active layer is formed as a quantum well type, the threshold current is reduced, and the fundamental transverse mode is maintained up to an optical output of 80 mWCW. Further, the average life is longer than 10000 hours under the conditions of an optical output of 40 mWCW and a temperature of 70° C. It is therefore obvious that the present invention is effective to produce a semiconductor laser which features stable transverse mode and high reliability.

BRIEF DESCRIPTION OF THE DRAWINGS

FIG. 6($b$) is a section view of the active layer; and

DETAILED DESCRIPTION OF THE PREFERRED EMBODIMENTS

Figure 1:
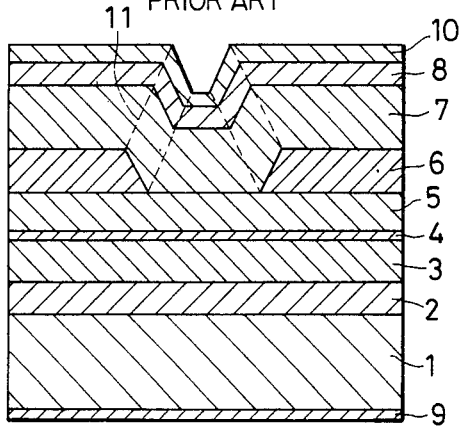
FIG. 1 is a section view of a conventional transverse mode-controlled laser.
Figure 2:
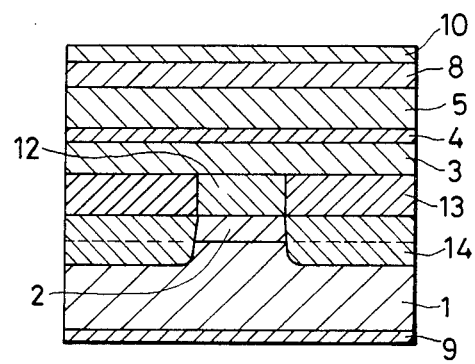
FIG. 2 is a section view of a transverse mode-controlled laser according to the present invention.

Embodiment 1:

FIG. 2 is a section view of a laser device of the present invention shown as a semiconductor laser of the GaAlAs type. As shown in FIG. 2, an n-GaAs layer (buffer layer 0.5 $\mu$m thick) 2 and an n-type super lattice layer (0.4 $\mu$m thick) 12 are formed on an n-GaAs substrate 1 by a well-known metal-organic chemical vapor deposition (MOVCD method). The n-type super lattice layer 12 is formed by laminating alternate GaAs films (2 nm thick) and $Ga_{0.5}Al_{0.5}As$ films (5 nm thick) each in a number of 55 layers, so that the light (wavelength, 780 nm) emitted from the active layer 4 is not absorbed. Two layers (each 120 nm thick) of $SiO_2$ and $SiN_x$ are formed by sputtering on the surface of the n-type super lattice layer 12. The sputtered layers are then removed by photolithography and etching except a stripe of the two layers having a width of 4 $\mu$m, so as to form a mask for selective diffusion. Zinc is diffused at 675° C. for 5 minutes to a depth of 1 $\mu$m to penetrate through the super lattice layer 12. Therefore, a p-inverted GaAs layer 14 is formed. After the mask for selective diffusion is removed, there are successively formed an $n-Ga_{0.55}Al_{0.45}$ layer (cladding layer which is 0.4 $\mu$m thick) 3, an undoped $p-Ga_{0.86}Al_{0.14}As$ layer (active layer which is 0.06 $\mu$m thick) 4, a $p-Ga_{0.55}Al_{0.45}As$ layer (cladding layer which is 1.5 $\mu$m thick) 5, and a p-GaAs layer (cap layer which is 0.5 $\mu$m thick) 8, by a MOCVD method. Finally, an Au/Mo/Ti electrode 10 and an Au/Au-Ge-Ni electrode 9 are formed as in an ordinary semiconductor laser, and the device is cleaved maintaining a cavity length of 300 $\mu$m.

According to this embodiment, an element which oscillates at a wavelength of 780 nm, which has a threshold current of 25 mA, and which maintains a fundamental transverse mode up to an optical output of 50 mWCW, is obtained with good reproduceability.

Figure 3:
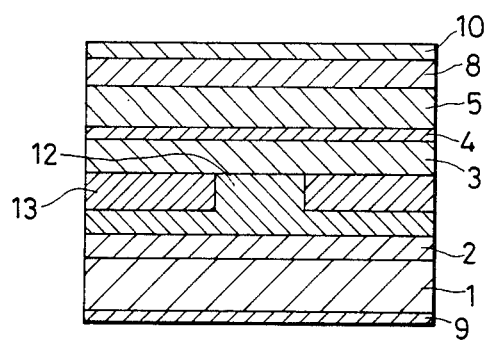
FIGS. 3 and 4 are section views of lasers according to other embodiments of the present invention.

Embodiment 2:

FIG. 3 shows an embodiment in which the semiconductor laser of Embodiment 1 is provided with an n-type super lattice layer 12 comprised of alternate GaAs layers (each 2 nm thick) and $Ga_{0.5}Al_{0.5}As$ layers (each 5 nm thick) that are laminated each in a number of 100 layers to a thickness of 0.7 $\mu$m, zinc is diffused to a depth of 0.5 $\mu$m, and some portions of the super lattice layer are left without being disordered in addition to the stripe region. With regard to other points, the structure is the same as that of Embodiment 1. This embodiment exhibits same characteristics as those of the Embodiment 1.

Figure 4:
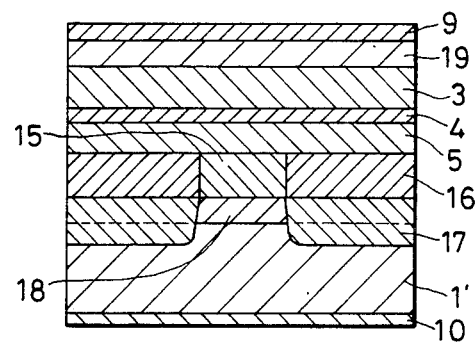

Embodiment 3:

FIG. 4 shows an embodiment in which the semiconductor laser of Embodiment 1 or Embodiment 2 employs a p-GaAs substrate 1, and conductivity types of the semiconductor layers are all inverted (p-type is inverted into n-type, and n-type is inverted into p-type), and the p-type super lattice layer 15 is disordered by the implantation of silicon ions. The super lattice layer 15 of this embodiment is comprised of alternates GaAs layers (each 2 nm thick) and $Ga_{0.5}Al_{0.5}As$ layers (each 5 nm thick) that are laminated each in a number of 55 layers. Except in radiation region, the super lattice layer is disordered by implanting silicon ions with the energy of about 200 KeV to form a layer 16. This embodiment also exhibits the same effects as those of Embodiment 1.

Figure 5:
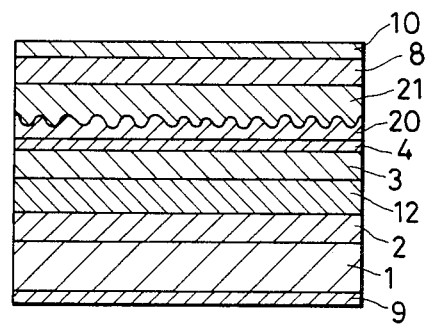
FIG. 5 is a side section view of a transverse mode-controlled laser in which the optical feedback is modified into the distribution feedback type according to the present invention.

Embodiment 4:

In the semiconductor laser of Embodiment 1, 2 or 3, an optical resonator may be provided with a diffraction lattice which effects the optical feedback relying upon a periodic grating, to produce a distributed feedback bragg reflection laser. FIG. 5 is a side section view in the stripe of the structure of Embodiment 1 in the form of a distributed feedback bragg reflection laser. As shown in FIG. 5, zinc is selectively diffused to disorder the super lattice in the same manner as in Embodiment 1, and the layers are grown up to a p-$Ga_{0.65}Al_{0.35}As$ layer (optical guide layer which is 0.2 μm thick) 20 by a MOCVD method. A photoresist layer is formed on the surface of the p-GaAlAs optical guide layer 20, and a periodic grating (having a depth of 500 angstroms) of a period of 2230 angstroms is formed by well-known interference exposure with two beams and by chemical etching. After the periodic grating is formed, a p-$Ga_{0.50}Al_{0.50}As$ layer (cladding layer which is 1.5 μm thick) 21 and a p-GaAs layer (cap layer 0.5 μm thick) 8 are grown by a MOCVD method. Finally, ohmic contacts 9, 10 are formed.

This embodiment makes it possible to maintain good reproduceability and obtain an element which oscillates at a wavelength of 780 nm, which has a threshold current of 30 mA, which does not exhibit hopping of the longitudinal mode up to an optical output of 30 mW, and which exhibits little change in oscillation wavelength irrespective of the temperature.

Figure 6A:
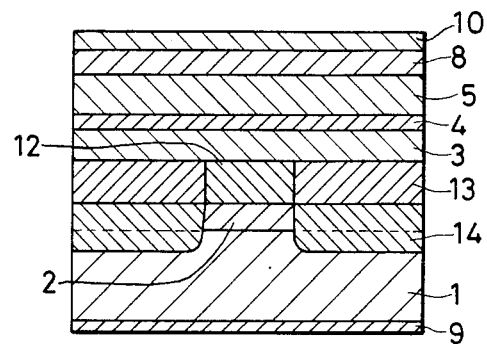
FIG. 6($a$) is a section view of a laser in which the active layer is formed as a quantum well type according to the present invention.
Figure 6B:
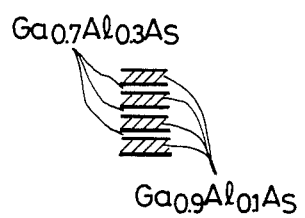

Embodiment 5:

In the semiconductor laser of the structure shown in Embodiment 1, 2, 3 or 4, the quantum well-type structure can be adapted to the active layer. FIG. 6(a) and 6(b) show an example which is suited for the structure of Embodiment 1. FIG. 6(a) is a section view of the device, and FIG. 6(b) shows a portion of the fine structure of the active layer 4.

The feature of this embodiment resides in the structure of the active layer 4. That is, the active layer is of a multiple quantum well type is formed by laminating four $Ga_{0.90}Al_{0.10}As$ quantum well layers each having a thickness of 10 nm and three $Ga_{0.70}Al_{0.30}$ As barrier layers each having a thickness of 3 nm alternately. This embodiment makes it possible to maintain good reproduceability and to obtain an element which oscillates at a wavelength of 780 nm, which has a small threshold current (15 mA), and which maintains a stable fundamental transverse mode up to an optical output of 80 mWCW. The active layers of the above-mentioned embodiments may be formed as a quantum well-type structure.

Figure 7:
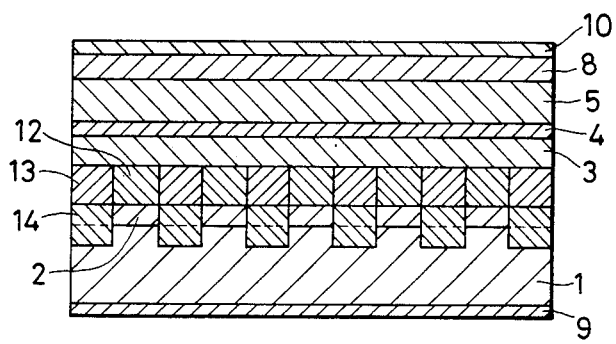
FIG. 7 is a section view of a transverse mode-controlled laser in which stripes are formed in a multiplied manner according to the present invention.

Embodiment 6:

In the semiconductor lasers of Embodiments 1 to 5, multiple stripes can be formed to perform the laser oscillation in order to fabricate a phased array semiconductor laser. FIG. 7 shows an embodiment in which five stripes are formed. The method of fabrication is nearly the same as that of Embodiment 1. In this embodiment, the width of the stripes is selected to be 3 μm, and the distance between the stripes is selected to be 4 μm, and there is obtained an element which oscillates at a wavelength of 780 nm, which has a threshold current of 105 mA, and which has a maximum optical output of 800 mW.

Though the above-mentioned embodiments have employed a MOCVD method to form the semiconductor layers, nearly the same effects can be obtained by using a MBE method. According to the present invention, the semiconductor laser of GaAlAs-type is not limited to the wavelength of 780 nm discussed in the embodiments, but exhibit the same results over a wavelength range of 690 nm to 890 nm. In addition to the GaAlAs-type material, the semiconductor laser of the present invention can be obtained by using compound semiconductor materials of, for example, InGaAsP, InGaP, and the like.

Embodiment 7:

A laser element of the structure similar to that of FIG. 2 is produced by alternately forming on a GaAs substrate, GaAs buffer layers (each having a thickness of 0.2 to 1.0 μm), InGaAsP films and GaAs films each in a number of five layers by a MOCVD method, forming thereon a cladding layer (0.2 to 0.8 μm thick), an active layer (0.2 to 1.0 μm thick), and a cap layer (0.5 μm thick) that are composed of an InGaAsP-type semiconductor material, and disordering portions of the super lattice in the same manner as in Embodiment 1. The element stably oscillates at a wavelength of 1.5 μm maintaining the fundamental transverse mode.

Embodiment 8:

A laser element is produced by forming on an InP substrate a super lattice layer that is comprised of a buffer layer, an InGaP film and an InP film, and forming thereon a cladding layer (0.2 to 1.0 μm thick), an active layer (0.2 to 1.0 μm thick) and a cap layer (0.2 to 1.0 μm thick) that are composed of an InGaP-type semiconductor material in the same manner as in FIG. 2. The laser element stably oscillates at a wavelength of 0.6 μm maintaining the fundamental transverse mode.

In the above-mentioned embodiment, the laser elements exhibit the same effects even when there exist semiconductor layers such as a light guiding layer or the like in addition to the buffer layer between the substrate and the super lattice layer.

What is claimed is:

1. A semiconductor laser which has at least a super lattice structure between a substrate and a light confinement layer of an active layer on the side of the substrate, and which has a region formed by disordering at least a portion of said super lattice, said disordered region being located in a portion of said super lattice structure except for a portion which corresponds to a stripe in which the laser oscillation takes place.

2. A semiconductor laser according to claim 1, wherein an effective forbidden band gap energy of the super lattice structure is greater than a forbidden band gap energy of the active layer.

3. A semiconductor laser according to claim 1 or 2, wherein the conductivity type of said super lattice structure is selected to be the same as the conductivity type of the substrate, and the conductivity type of the region formed by disordering said super lattice structure is selected to be different from the conductivity type of the substrate, such that the disordered region of said super lattice structure works as a current blocking layer.

4. A semiconductor laser according to claim 1, wherein the active layer consists of at least one or more quantum well layers having a thickness of 5 angstroms to 300 angstroms.

5. A semiconductor laser according to claim 1, wherein the disordered region of the super lattice structure is so formed as to constitute two or more stripes in which the laser oscillation takes place.

6. A semiconductor laser according to claim 1, wherein an optical resonator is provided with a diffraction lattice which effects the optical feedback relying upon a periodic grating, thereby to constitute a distributed feedback bragg reflection structure.

7. A semiconductor laser according to claim 1, wherein the semiconductor constituting said semiconductor laser is at least one of GaAlAs, InGaAsP or InGaP.

8. A semiconductor laser according to claim 1, wherein said active layer is of a quantum well type.

9. A semiconductor laser comprising:
a semiconductor substrate;
a buffer layer formed on said semiconductor substrate;
a super lattice structure formed on said buffer layer and including a disordered region formed outside of a stripe region in which laser oscillation takes place;
a first cladding layer formed on said super lattice structure;
an active layer formed on said first cladding layer;
a second cladding layer formed on said active layer;
a cap layer formed on said second cladding layer; and
electrodes formed on both said cap layer and a surface of said semiconductor substrate opposite said buffer layer.

10. A semiconductor laser according to claim 9, wherein an effective forbidden band gap energy of said super lattice structure is greater than a forbidden band gap energy of said active layer.

11. A semiconductor laser according to claims 9 or 10, wherein the conductivity type of said super lattice structure is selected to be the same as the conductivity type of said semiconductor substrate, and the conductivity type of said disordered region is selected to be different from the conductivity type of said semiconductor substrate, such that said disordered region acts as a current blocking layer.

12. A semiconductor laser according to claim 9, wherein said active layer consists of at least one quantum well layer having a thickness of 5 to 300 angstroms.

13. A semiconductor laser according to claim 9, wherein said disordered region is formed so as to produce two or more stripe regions in which laser oscillation takes place.

14. A semiconductor laser according to claim 9, further comprising an optical resonator formed in said second cladding layer, having a diffraction lattice which effects the optical feedback relying on a periodic grating, so as to produce a distributed feedback Bragg reflection structure.

15. A semiconductor laser according to claim 9, wherein said layers are a compound semiconductor material selected from the group consisting of GaAlAs, InGaAsp and InGaP.

16. A semiconductor laser according to claim 9, wherein said active layer is of quantum well type.

* * * * *